(12) United States Patent
Masuda et al.

(10) Patent No.: US 7,320,812 B2
(45) Date of Patent: Jan. 22, 2008

(54) METHOD FOR MANUFACTURING COATED SHEET, OPTICAL FUNCTIONAL LAYER, OPTICAL ELEMENT, AND IMAGE DISPLAY DEVICE

(75) Inventors: Tomoaki Masuda, Ibaraki (JP); Kazuki Tsuchimoto, Ibaraki (JP); Seiji Kondou, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 578 days.

(21) Appl. No.: 10/641,117

(22) Filed: Aug. 15, 2003

(65) Prior Publication Data

US 2004/0037953 A1 Feb. 26, 2004

(30) Foreign Application Priority Data

Aug. 22, 2002 (JP) ............................. 2002-241350
Jul. 23, 2003 (JP) ............................. 2003-200542

(51) Int. Cl.
*B05D 5/06* (2006.01)
(52) U.S. Cl. ...................... 427/162; 427/164; 427/166; 349/123; 349/124
(58) Field of Classification Search ................ 427/162, 427/164, 166; 34/451
See application file for complete search history.

(56) References Cited

U.S. PATENT DOCUMENTS

| | | | |
|---|---|---|---|
| 4,598,304 A * | 7/1986 | Tanaka et al. ................. 257/9 |
| 5,881,476 A * | 3/1999 | Strobush et al. ............... 34/451 |
| 5,968,708 A * | 10/1999 | Yashiro et al. ........... 430/270.1 |
| 6,315,873 B1* | 11/2001 | Lowe et al. .......... 204/192.15 |
| 2003/0121544 A1* | 7/2003 | Hirata et al. ................. 136/256 |

FOREIGN PATENT DOCUMENTS

| | | |
|---|---|---|
| JP | 62-140672 | 6/1987 |
| JP | 8-240713 | 9/1996 |
| JP | 9-73016 | 3/1997 |

OTHER PUBLICATIONS

Office Action of Corresponding Chinese Patent Application No. 03154930.6 mailed May 12, 2006.

* cited by examiner

*Primary Examiner*—Alain L. Bashore
(74) *Attorney, Agent, or Firm*—Westerman, Hattori, Daniels & Adrian LLP

(57) ABSTRACT

A method for manufacturing a coated sheet that may form a coated layer having a uniform film thickness by a coating liquid even when a substrate has a large area is provided.

A method for manufacturing a coated sheet to form a coated layer by a process including a process (1) for coating a coating liquid including a resin material and a solvent on a substrate, and a drying process (2) for drying a coated liquid, wherein a drying is performed under drying wind flow having an average wind speed of 10 m/s or less until a viscosity of the coated liquid in the drying process (2) reaches at least 50 [mPa·s] at drying temperatures.

15 Claims, 1 Drawing Sheet

METHOD FOR MANUFACTURING COATED SHEET, OPTICAL FUNCTIONAL LAYER, OPTICAL ELEMENT, AND IMAGE DISPLAY DEVICE

BACKGROUND OF THE INVENTION

1. Field of the Invention

The present invention relates to a method for manufacturing a coated sheet. A method of this invention is useful in formation of, for example, an optical functional layer. In particular, this invention relates to an optical element using the optical functional layer concerned. The optical elements etc. are suitably utilized in various image display devices, such as liquid crystal displays (LCD), organic electroluminescence display devices, PDPs, and CRTs.

2. Prior Art

Conventionally, various kinds of coated sheets obtained by forming a coated layer by way of giving processes, such as coating, drying, etc. of a coating liquid onto a surface of a base material film have been manufactured. As coating method for the above-mentioned coating liquid, various methods, such as a slot die method, a reverse photogravure coating method, and a micro photogravure method, are adopted.

As coated sheets, for example, various kinds of optical films having optical functi nal layers may be mentioned.

In displays of OA equipment, such as TVs and desktop PCs, CRTs that have been conventionally in the mainstream are now being replaced by liquid crystal displays having large advantages of, such as being thin and light weight and of low power consuming. Liquid crystal displays now widespread comprise liquid crystal layers for forming retardation films, hard coat layers for surface protection, and surface treatment coated layers, such as antireflection films.

Optical functional layers are formed with thin films as request for upgraded performance of optical function is increased. When the thin film concerned has unevenness in film thickness, the unevenness decreases displaying capabilities of image viewing displays, such as liquid crystal display using the film. Therefore, it is required that optical functional layers should have uniform film thickness. However, in any coating methods, a flow of resin occurred in a transition period from a coating process to a drying process, and the flow of the resin made difficult formation of coated layer with a uniform film thickness. Accordingly, it was difficult to form a coated layer having a uniform film thickness on a base material film with a particularly wide area.

For example, when a hard coat layer, an antireflection layer, etc. are formed on a high polymer film, resin layers laminated have different refractive indexes, which lead to problem with serious coherence unevenness caused by thickness unevenness based on flow of the resin after coated. In this case, since differences arise in optical thickness within a surface, reflectance also gets smaller than a theoretical value.

In general, liquid crystal molecules forming a liquid crystal layer show tendency of being easily influenced by characteristics of an interface, and it is known that an interfacial regulating force, such as rubbing treatment, will accelerate alignment (orientation) of liquid crystal molecules based on aromatic groups. Since one side of a coated liquid including liquid crystal molecules is opened in case of the above-mentioned coating method, in usual coating and drying methods, air flow on the open side generates resulting orientation unevenness of the liquid crystal layer. Therefore, the liquid crystal layer obtained in this way has a problem that some portions of a liquid crystal display have unevenness in front contrast.

SUMMARY OF THE INVENTION

The present invention aims at providing a method for manufacturing a coated sheet that may form a coated layer having a uniform film thickness by a coating liquid even when a substrate has a large area. Also this invention aims at providing an optical functional layer obtained by the method concerned, an optical functional layer concerned with the optical element formed thereon, and an image display device using the optical element concern d.

As a result of a wholehearted examination carried out by the present inventors in order to solve the above-mentioned subjects, it was found out that the above-mentioned object might be attained by a method for manufacturing the coated sheet shown below, and it led to completion of this invention.

That is, this invention relates to a method for manufacturing a coated sheet to form a coated layer by a process including a process (1) for coating a coating liquid including a resin material and a solvent on a substrate, and a drying process (2) for drying a coated liquid, wherein a drying is performed under drying wind flow having an average wind speed of 10 m/s or less until a viscosity of the coated liquid in the drying process (2) reaches at least 50 [mPa·s] at drying temperatures.

In a coated liquid given on a substrate, drying advancing immediately after coating process has a tendency of forming irregularity in a film thickness during the drying process. In early stages of drying, drying of the solvent in the coated liquid progresses by a constant-rate drying, and subsequently changes to a decreased-rate drying. It turned out that a constant-rate drying having a high drying speed affects uniformity of the thickness of the coated layer, and variation in drying speed at this time affects uniformity of the thickness of the coated layer. Moreover, when a drying speed is raised by alteration of drying conditions etc., before constant-rate drying is completed, a higher drying speed after alteration more greatly affects the uniformity of the thickness of the coated layer. It also turned out that since a higher drying speed more greatly receives variation by external disturbance, which deteriorates the uniformity of the thickness of the coated layer.

Accordingly, in the present invention, in processes immediately after coating up to drying process, drying is performed under a drying wind flow having an average wind speed of 10 m/s or less until the viscosity of the coated liquid in the drying process (2) reaches at least 50 [mPa·s] at drying temperatures, and thereby, poor appearance and drying unevenness within a surface caused by thickness unevenness resulting from a flow of the resin that occurs while transferred to the drying process from the coating process are prevented, leading to formation of a uniform coated layer. Thus occurrence of coherence unevenness caused by thickness difference on a coated surface is controlled, and a coated layer without poor appearance may be formed. Drying is preferably carried out under a drying wind flow having an average wind speed of 10 m/s or less until the viscosity of the coated liquid reaches at least 50 [mPa·s] at drying temperatures, more preferably at least 60 [mPa·s], and still more preferably at least 80 [mPa·s]. Drying is preferably carried out under a drying wind flow having an average wind speed of 10 m/s or less. Moreover, an average wind speed of the drying wind flow is preferably to be set as 5 m/s or less, and more preferably 3 m/s or less in order to prevent drying unevenness within a coated surface and to form a uniform coated film. In addition, since an excessive low average wind speed of drying wind flow lengthens drying periods, an average wind speed is preferably set as no less than 0.1 m/s, and more preferably no less than 0.5 m/s.

A method for manufacturing a coated sheet of this invention may be suitably applied, also when a substrate has a large area. For example, it may be suitably applicable also when a substrate has a width of 500 mm or more, and moreover a width of 800 mm or more.

In the above-mentioned method for manufacturing a coated sheet, an initial viscosity of a coated liquid in a drying process (2) preferably has 0.1 through 20 [mPa·s] at 25° C. A method of this invention is particularly useful when using a coating liquid having a low viscosity. It is useful when an initial viscosity of the above-mentioned coated liquid has 0.1 through 18 [mPa·s], and moreover preferably 0.1 through 15 [mPa·s].

In the above-mentioned method for manufacturing a coated sheet, it is preferable that a coated layer after drying is a thin film having a thickness of 10 μm or less. When a thickness after drying exceeds 10 μm, concentration distribution and convection flow of the coating liquid in a thickness direction of the coated layer will arise, and, as a result, uniformity of the coated layer will be easy to be lost. In a m thod of this invention, it is preferable that a thickness after drying of the coated layer is 0.1 through 10 μm, and especially preferably 0.1 through 8 μm.

The above-mentioned method for manufacturing a coated sheet is preferred when a coated layer is an optical functional layer, and a uniform optical functional layer as a thin layer may be obtained using the above-mentioned method for manufacturing a coated sheet.

The above-mentioned method for manufacturing a coated sheet is particularly useful in production of films having optical functional layers, such as antireflection films and liquid crystal layers for optical intended uses, and thus poor appearance of a coated surface and poor orientation of a liquid crystal layer caused by thickness difference are effectively canceled, and optical films as required by optical design may be obtained.

This invention also relates to an optical element characterized by having the above-mentioned optical functional layer formed on one side or both sides of the optical element. It further relates to an image display device having the above-mentioned optical functional layer or the optical element according to claim 8 mounted thereon.

DESCRIPTION OF THE PREFERRED EMBODIMENTS

Figure 1:
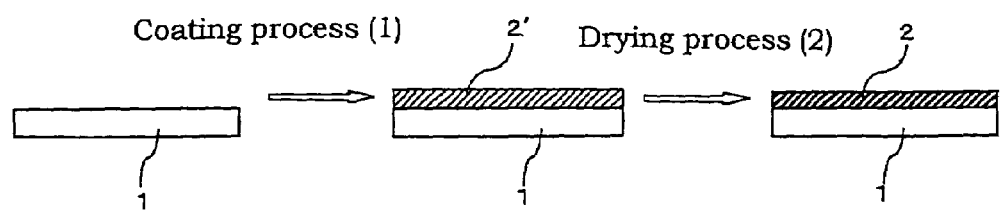
FIG. 1 shows a conceptual diagram of a method for manufacturing a coated sheet of this invention.

A substrate and a coating liquid used for a method for manufacturing a coated sheet of the present invention are suitably determined according to a type and an application of the coated layer to be formed.

Any kinds of materials are sufficient, if they are layers of materials having a certain degree of wettability with respect to a coating liquid as a substrate, and photoresists etc. may be mentioned excluding transparent base material films and various glass plates.

When forming an optical functional layer using a coating liquid, it is preferable to use a transparent base material film as a substrate.

As materials of the above-mentioned transparent substrate, for example, polyester type polymers, such as polyethylene terephthalate and polyethylenenaphthalate; cellulose type polymers, such as diacetyl cellulose and triacetyl cellulose; acrylics type polymer, such as poly methylmethacrylate; styrene type polymers, such as polystyrene and acrylonitrile-styrene copolymer (AS resin); polycarbonate type polymer may be mentioned. Besides, as examples of the polymer forming transparent substrate, polyolefin type polymers, such as polyethylene, polypropylene, polyolefin that has cycle-type or norbornene structure, methylenepropylene copolymer; vinyl chloride type polymer; amide type polymers, such as nylon and aromatic polyamide; imide type polymers; may be mentioned. And the polymer forming transparent substrate, sulfone type polymers; polyether sulfone type polymers; polyether-ether ketone type polymers; poly phenylene sulfide type polymers; vinyl alcohol type polymer; vinylidene chloride type polymers; vinyl butyral type polymers; allylate type polymers; polyoxymethylene type polymers; epoxy type polymers; or blend polymers of the above-mentioned polymers may be mentioned. Especially in optical property, a film having small birefringence is suitably used.

Moreover, as is described in Japanese Patent Laid-Open Publication No. 2001-343529 (WO 01/37007), polymer films, for example, resin compositions including (A) thermoplastic resins having substituted and/or non-substituted imide group is in side chain, and (B) thermoplastic resins having substituted and/or non-substituted phenyl and nitrile group in sidechain may be mentioned. As an illustrative example, a film may be mentioned that is made of a resin composition including alternating copolymer comprising iso-butylene and N-methyl maleimide, and acrylonitrile-styrene copolymer. A film comprising mixture extruded article of resin compositions etc. may be used.

A thickness of a transparent substrate is determined appropriately, and in general, it is approximately 10 to 500 μm so that it may have suitable thinness, or in viewpoint of workability, such as strength and handling property. Especially it is preferably 20 to 300 μm, and more preferably 30 to 200 μm.

If a coating liquid used for this invention is able to form a coated film, any kinds of liquid may be applicable, and resin materials and solvents for a coating liquid may be selected corresponding to performances of a target coated layer. As coated layers formed using a method for coating of this invention, there may be mentioned optical functional layers, antistatic layers, surface protective layers, electric conductive functional layers, pressure sensitive adhesive layers, bonding adhesive layers, transparent coated layers, etc. may be mentioned. In addition, formation of a coat with a coating liquid may be performed using a method to sequentially form layers onto a substrate. Therefore, a substrate with coated films beforehand formed thereon may be used. When an optical functional layer is formed as a coated layer in this invention, it is particularly preferable that an optical functional layer with a thickness of 10 μm or less is formed. As the optical functional layers concerned, hard coat layers, antireflective layers, retardation layers, optical compensation layers, etc. may be mentioned.

As transparent resins for forming a hard coat layer, if it is a resin having outstanding hard coat property (pencil hardness test of JIS K5400 shows a hardness of "H" or more), has a sufficient strength and has an outstanding light transmittance, any kinds may be applicable without any limitations. For example, thermosetting type resins, thermoplastic type resins, ultraviolet curable type resins, electron beam curable resins, two-component mixing type resins, etc. may be mentioned as examples of the above-mentioned resins. Among them, ultraviolet curable type resins are preferable that may efficiently form an optical diffusion layer using a simple processing operation, such as curing treatment with ultraviolet rays irradiation etc. The resins of ultraviolet curable type include various kinds of resins, such as polyester based, acrylics based, urethane based, amide based, silicone based, and epoxy based, and further monomers, oligomers, polymers of ultraviolet curing type, etc. As ultraviolet curable type resins preferably used, resins having functional groups with ultraviolet rays polymerizable property, for example, may be mentioned. Especially, resins including acrylics based monomer and oligomer components having two or more, especially three through six functional groups concerned may be mentioned. In addition, an ultraviolet rays polymerization initiator is blended in the ultraviolet curable type resins.

A hard coat layer may include conductive fine-grains. As conductive fine-grains, for example, metal fine-grains, such as aluminum, titanium, tin, gold, and silver, and ultra fine grains, such as ITO (indium oxide/tin oxide) and ATO (antimony oxide/tin oxide) may be mentioned. It is preferable that a mean diameter of grains of the conductive ultra fine grains is usually approximately 0.1 μm or less. Ultra fine grains of metals or metal oxides having a high refractive index may be added into a hard coat layer to adjust a high refractive index. As ultra fine grains having a high refractive index, ultra fine grains of metal oxides, such as $TiO_2$, $SnO_2$, $ZnO_2$, $ZrO_2$, aluminium oxide, and zinc oxide, may be mentioned. It is preferable that a mean diameter of grains of the ultra fine grains is usually approximately 0.1 μm or less.

Moreover, antiglare property may be given to a hard coat layer by dispersing inorganic or organic fillers having a globular form or an infinite form to give fine irregular structures to a front face, and thus antiglare property may be given to the hard coat layer. Antiglare property caused by optical diffusion may be realized by providing irregular surface form to a front face of the hard coat layer. Optical diffusion property is preferable also for reducing reflectance.

As inorganic or organic fillers having a globular form or an infinite form, for example, there may be mentioned: organic cross-linked or non cross-linked fine-grains comprising various polymers, such as PMMAs (poly methylmethacrylates), polyurethanes, polystyrenes, and melamine resins; inorganic grains, such as glass, silicas, aluminas, calcium oxides, titanias, zirconium dioxide, and zinc oxide; and conductive inorganic particles, such as tin oxides, indium oxide, cadmium oxides, antimony oxides, or compounds thereof. A mean diameter of grains of the above-mentioned fillers is 0.5 through 10 μm, and preferably 1 through 4 μm. When fine irregular structures are formed by fine-grains, an amount of fine-grains used is preferably approximately 1 through 30 parts by weight to resins 100 parts by weight.

Moreover, additives, such as leveling agents, thixotropy agents, and antistatic agents may be included in formation of a hard coat layer (antiglare layer). In formation of a hard coat layer 2 (antiglare layer), thixotropic agents (silica, mica, etc. having a diameter of grains of 0.1 μm or less) are blended, and thereby protruding fine grains easily form a irregular fine structures on a surface of the antiglare layer.

As materials for forming antireflective layers, for example, resin based materials, such as ultraviolet curing type acrylic resins; hybrid materials having inorganic fine grains dispersed in resins, such as colloidal silica; and sol-gel materials using metal alkoxides, such as tetra ethoxy silane and titanium tetra ethoxide, etc. may be mentioned. Compounds including fluoride groups are used for each material in order to give soil resistance to a surface. Low refractive index layer material including a large amount of mineral elements has a tendency to show excellent scratch-proof property, and among them particularly sol-gel based materials are preferable. Sol-gel based materials may be used after partial condensation reaction.

Perfluoroalkyl alkoxy silanes may be illustrated as the above-mentioned sol-gel based materials including fluoride groups. As perfluoroalkyl alkoxy silanes, for example, compounds represented by a general formula (1): $CF_3(CF_2)_n CH_2CH_2Si(OR)_3$ (where R represents alkyl group with 1 through 5 carbon numbers, and n represents an integer of 0 through 12) may be mentioned. Specifically, there may be mentioned; trifluoro propyl trimethoxy silane, trifluoro propyl triethoxy silane, tridecafluoro octyl trimethoxy silane, tridecafluoro octyl triethoxy silane, heptadecafluoro decyl trimethoxy silane, heptadecafluoro decyl triethoxy silane, etc. Especially, compounds whose n gives 2 through 6 are preferable.

Sols in which silica, alumina, titania, zirconia, magnesium fluorides, ceria, etc. are dispersed in an alcoholic solvent may be added into an antireflective layer. In addition, additives, such as metal salts and metal compounds, may suitably be blended.

In formation of a retardation layer and an optical compensation layer, for example, polymerizable crystalline liquid monomers and/or liquid crystal polymers may be used. As the above-mentioned polymerizable crystalline liquid monomers, for example, nematic liquid crystalline monomer may be mentioned. When polymerizable crystalline liquid monomers are included, photo polymerization initiators are usually included. As photo polymerization initiators, various kinds may be used without particular limitation.

As nematic liquid crystalline monomers, monomers that has polymerizable functional groups, such as acryloyl group and methacryloyl group at end groups, and has mesogen groups including cyclic units etc. in this may be mentioned. Moreover, cross-linking structures may be introduced using monomers having two or more of acryloyl groups, methacryloyl groups, etc., as polymerizable functional groups, to improve durability. As the above-mentioned cyclic units serve as mesogen groups, for example, there may be mentioned: biphenyl based, phenyl benzoate based, phenyl cyclohexane based, azoxy benzene based, azo methine based, azobenzene based, phenyl pyrimidine based, diphenyl acetylene based, diphenyl benzoate based, bicyclo hexane based, cyclo hexyl benzene based, terphenyl based units, etc. In addition, these cyclic units may have substituents, such as, cyano groups, alkyl groups, alkoxy groups, and halogen groups, as end groups.

As principal chain type liquid crystal polymers, condensation polymers having a structure where mesogen groups comprising aromatic series units etc. are combined, for example, polyester based and polyamide based, polycarbonate based and polyester imide based polymers may be mentioned. As the above-mentioned aromatic series unit serves as mesogen groups, units of phenyl based, biphenyl based, and naphthalene based may be mentioned, and these aromatic series units may have substituents, such as cyano groups, alkyl groups, alkoxy groups, and halogen groups.

As side-chain type liquid crystal polymers, polymers having acrylic resin based, poly methacrylate based, polysiloxane based, and poly malonate based principal chain as a skeleton, and having mesogen groups with side-chain comprising cyclic units etc. may be mentioned. As the above-mentioned cyclic unit providing mesogen groups, for example, there may be mentioned: biphenyl based, phenyl benzoate based, phenyl cyclohexane based, azoxy benzene based, azo methine based, azobenzene based, phenyl pyrimidine based, diphenyl acetylene based, diphenyl benzoate based, bicyclo hexane based, cyclo hexyl benzene based, terphenyl based units etc. In addition, end groups of these cyclic units may have substituents, such as cyano groups, alkyl groups, alkoxy groups, and halogen groups.

Any mesogen groups of the above-mentioned polymerizable crystalline liquid monomer and liquid crystal polymer may be bonded via spacer parts giving flexibility. Polymethylene chains, polyoxymethylene chains, etc. may be mentioned as spacer parts. A number of repetitions of structural units forming the spacer parts is suitably determined by chemical structures of mesogenic parts, and a number of repetition units of polymethylene chain is 0 through 20, and preferably 2 through 12, and a number of repetition units of polyoxymethylene chain is 0 through 10, and preferably is 1 through 3.

The above-mentioned nematic liquid crystalline monomers and liquid crystalline polymers include a material demonstrating homeotropic alignment in a liquid crystal state. Cholesteric liquid crystalline monomers and chiral agents may be blended into the above-mentioned nematic liquid crystalline monomers and liquid crystal polymers so that cholesteric phase may be presented in liquid crystal state. In addition, cholesteric liquid crystal polymers may be used. Obtained cholesteric liquid crystal phase is used as a selective reflection film. Particularly as chiral agents, if it is chiral agent having optical activity groups and not disturbing orientation of nematic liquid crystalline monomers etc., any agents may be used without particular limitation. Chiral agents may have liquid crystalline property or may not have liquid crystalline property, and agents showing cholesteric liquid crystalline property may preferably be used. Although any chiral agents having or not having reactive groups may be used, agents having reactive groups are preferable in view of heat resistance and solvent resistance of cholesteric liquid crystal oriented films obtained by being cured. As reactive groups, acryloyl group, for example, methacryloyl group, azido group, epoxy group, etc. may be mentioned.

Moreover, optical anisotropy layers comprising inclined alignment layer of discotic liquid crystal is used as an optical compensation retardation layer. As discotic liquid crystals, a liquid crystal indicated in Japanese Patent Laid-Open No. 8-94836(1996) official report etc. may be illustrated.

Besides, the above-mentioned liquid crystal monomers and liquid crystal polymers may be developed on oriented films. As oriented films, various kinds of films conventionally known may be used, for example, there may be used films in which a thin film comprising polyimides or polyvinylalcohols, etc. is formed on a transparent base material, and then rubbing processing is given thereto; stretched films obtained by stretching processing of transparent films; and polymers in which polarized ultraviolet rays are irradiated to polymers having cinnamate skeleton and azobenzene skeleton, or polyimides.

As solvents usable for coating liquids, there may be used: aromatic based solvents, such as benzene, toluene, xylene, methoxy benzene, 1,2-dimethoxy benzene; ester based solvents, such as ethyl acetate and butyl acetate; alcoholic based solvents, such as methanol, ethanol, isopropanol, tert-butyl alcohol, glycerol, ethylene glycol, and triethylene glycol; phenol based solvents, such as phenol and parachlorophenol; ketone based solvents, such as acetone, methyl ethyl ketone, and cyclohexanone; amide based solvents, such as dimethyl formamide, dimethyl acetamide, and dimethyl sulfoxide; ether based solvents, such as tetrahydrofuran; cellosolve based solvents, such as ethylene glycol monmethyl ether, diethylene glycol dimethyl ether, ethyl cellosolve, and butyl cellosolve; halogenated hydrocarbon based solvents, such as chloroform, methylene chloride, dichloroethane, tetrachloro ethane, trichloroethylene, tetrachloroethylene, and chlorobenzene; sulfoxide based solvent; in addition, 2-pyrolidone, N-methyl-2-pyrolidone, pyridine, triethylamine, acetonitrile, butyronitrile, carbon disulfide. These solvents may be used independently or two or more kinds of the solvents may be used in combination.

A resin component concentration of a coating liquid is not especially limited, but is usually 1 through 60% by weight, and preferably 5 to 50% by weight. Various kinds of additives may be included to the coating liquid according to usages to which a coated layer formed from the coating liquid is applied.

Description for a method for manufacturing a coated sheet of this invention will be given with reference to following drawings. A method for manufacturing a coated sheet of this invention comprises processes of: (1) coating a coating liquid on a substrate; and (2) drying a coated liquid coated on the substrate. FIG. 1 shows a sectional view of a coated sheet A in which a coated layer 2 is formed on a substrate 1, after a coating liquid 2' was coated.

Coating methods of the coating liquid 2' in the coating process (1) are not especially limited, but usual methods may be adopted. For example, a slot die method, a reverse photogravure coat method, a micro photogravure method, a dip method, a spin coat method, a brush applying method, a roll coat method, a flexography printing method, etc. may be mentioned.

Drying methods in the drying process (2) are not especially limited, but usual heat means may be adopted. For example, a hot wind method, a heating roller method, a far-infrared heater method, etc. may be mentioned. Drying is performed using a hot wind machine and the like under a drying air flow having an average wind speed of 10 m/s or less until a viscosity of the coated liquid reaches at least 50 [mPa·s]. Usually, a drying temperature is in a range of approximately 30 through 200° C., and preferably is in a range of 30 through 150° C. Morover, a drying time is approximately 5 through 500 seconds, and preferably 10 through 300 seconds.

Figure 2:
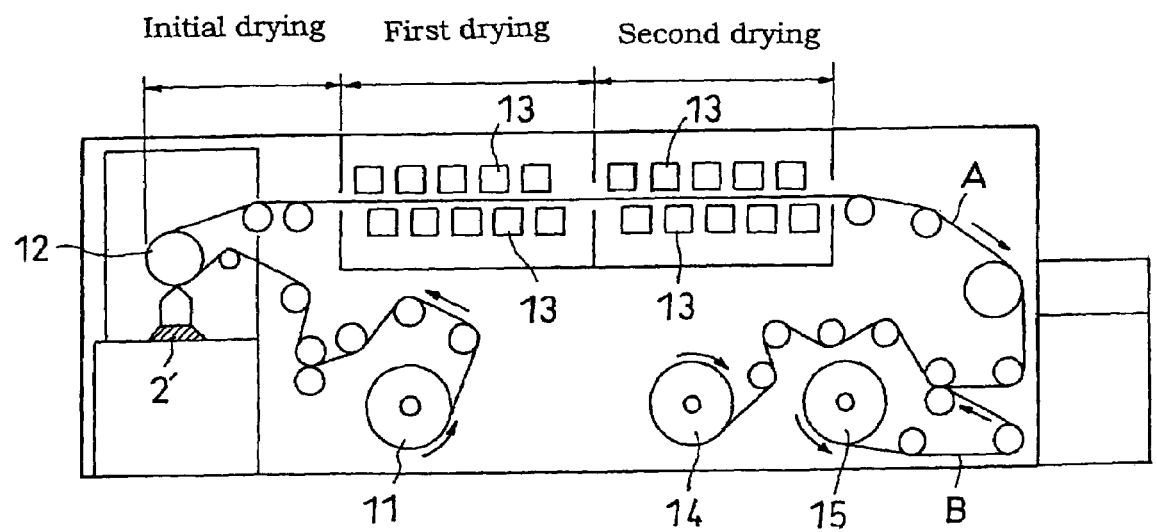
FIG. 2 shows a conceptual diagram of a coating device manufacturing a coated sheet of this invention.

FIG. 2 shows an example of conceptual diagram of a coating device used for the method for manufacturing a coated sheet. A coating liquid 2' is coated with a coating roll 12 onto a substrate 1 conveyed from a delivery roller 11, and then, the substrate 1 proceeds to a drying step. A drying process is divided into an initial drying process, a first heat drying process, and a second heat drying process in a coating device in FIG. 2. The initial drying process is usually performed at ordinary temperature. In a first heat drying process and a second heat drying process, a hot wind machine is provided as a heating means 13. Drying temperatures are preferably set higher as a drying process advances. Drying temperatures and drying times in the first heat drying process and the second heat drying process are adjusted so that rates of drying of the coated liquid and viscosity of the coating liquid may be in the above-mentioned ranges according to types of the coating liquid. After the drying process, a coated sheet A in which the coated layer 2 is formed on the substrate 1 is rolled up by a rolling up roll 14. In addition, the coated layer 2 on the coated sheet A is protected by a protective sheet B fed out from a roll 15.

After the drying process (2), hardening treatment, such as heat curing, UV hardening, etc. may be further performed according to types of the coating liquid. Thus obtained coated layer may be used, without being separated from the substrate, or may be used separated from the substrate.

Description will be given below about an example in which an optical film (a hard coat film) having a hard coat layer (or antireflection layer) formed thereon as an optical functional layer is applied for an optical element. Optical elements may be adhered to a transparent base material film of the above-mentioned hard coat film. Polarizers may be mentioned as optical elements. Moreover, as optical elements, optical functional layers, such as the above-mentioned retardation layer and optical compensation layer, may be applicable.

The polarizer is not especially limited but various kinds may be used. As a polarizer, for example, a film that is uniaxially stretched after having dichromatic substances, such as iodine and dichromatic dye, absorbed to hydrophilic high molecular weight polymer films, such as polyvinyl alcohol type film, partially formalized polyvinyl alcohol type film, and ethylene-vinyl acetate copolymer type partially saponified film; poly-ene type alignment films, such as dehydrated polyvinyl alcohol and dehydrochlorinated polyvinyl chloride, etc. may be mentioned. In these, a polyvinyl alcohol type film on which dichromatic materials (iodin, dyes) is absorbed and aligned after stretched is suitably used. Although thickness of polarizer is not especially limited, the thickness of about 5 to 80 μm is commonly adopted.

A polarizer that is uniaxially stretched after a polyvinyl alcohol type film dyed with iodine is obtained by stretching a polyvinyl alcohol film by 3 to 7 times the original length, after dipped and dyed in aqueous solution of iodine. If needed the film may also be dipped in aqueous solutions, such as boric acid and potassium iodide, which may include zinc sulfate, zinc chloride. Furthermore, before dyeing, the polyvinyl alcohol type film may be dipped in water and rinsed if needed. By rinsing polyvinyl alcohol type film with water, effect of preventing un-uniformity, such as unevenness of dyeing, is expected by making polyvinyl alcohol type film swelled in addition that also soils and blocking inhibitors on the polyvinyl alcohol type film surface may be washed off. Stretching may be applied after dyed with iodine or may be applied concurrently, or conversely dyeing with iodine may be applied after stretching. Stretching is applicable in aqueous solutions, such as boric acid and potassium iodide, and in water bath.

A transparent protective film is usually provided on one side or both sides of the above described polarizer to be used as a polarizing plate. As a transparent protective film, materials excellent in transparency, mechanical strength, heat stability, water shielding property, isotropy, etc. are preferable. As transparent protective films, a film of same material as the transparent substrate in the above described illustration may be used. As the above described transparent protective film, a transparent protective film whose both sides, surface side and backside, are formed from same polymer material may be used, and also a transparent protective film whose both sides are formed by different polymer materials etc. may be used. Films excellent in transparency, mechanical strength, heat stability, moisture barrier property, etc. are preferably used. In many cases, transparent protective films having small degree of optical anisotropic property, such as retardation and the like, are preferable. As polymers forming the above-mentioned transparent protective film, triacetyl cellulose is optimal. When the above-mentioned hard coat film is formed on one side or both sides of a polarizer (polarizing plate), a transparent base material film of the hard coat film may serve also as a transparent protective film of the polarizer. Although a thickness of the transparent protective film is not especially limited, it is about 10 through 300 μm in general.

Moreover, it is preferable that the transparent protective film may have as little coloring as possible. Accordingly, a protective film having a phase difference value in a film thickness direction represented by $Rth=[(nx+ny)/2-nz]\times d$ of −90 nm through +75 nm (where, nx and ny represent principal indices of refraction in a film plane, nz represents refractive index in a film thickness direction, and d represents a film thickness) may be preferably used. Thus, coloring (optical coloring) of polarizing plate resulting from a protective film may mostly be cancelled using a protective film having a phase difference value (Rth) of −90 nm through +75 nm in a thickness direction. The phase difference value (Rth) in a thickness direction is preferably −80 nm through +60 nm, and especially preferably −70 nm through +45 nm.

An antireflective polarizing plate having a polarizing plate laminated onto a hard coat film may be obtained by sequentially laminating a transparent protective film, a polarizer, and a transparent protective film, or otherwise a polarizer and a transparent protective film may be sequentially laminated onto a hard coat film.

As the opposite side of the polarizing-adhering surface above-mentioned transparent protective film, a film with a hard coat layer and various processing aiming for sticking prevention and diffusion or anti glare may be used. A hard coat processing is applied for the purpose of protecting the surface of the polarizing plate from damage, and this hard coat film may be formed by a method in which, for example, a curable coated film with excellent hardness, slide property etc. is added on the surface of the transparent protective film using suitable ultraviolet curable type resins, such as acrylic type and silicone type resins. Besides, a sticking prevention processing is applied for the purpose of adherence prevention with adjoining layer. In addition, the above described hard coat layer and sticking prevention layer etc. may be built in the protective film itself, and also they may be prepared as an optical layer different from the protective layer.

In addition, a hard coat layer, a primer layer, a bonding adhesive layer, a pressure sensitive adhesive layer, an antistatic layer, a conductive layer, a gas barrier layer, a steam barrier layer, moisture barrier layer, etc. may be laminated between layers of a polarizing plate, and they may be laminated onto a surface of the polarizing plate. Moreover, in a stage where each layer of the polarizing plate is applied, for example, conductive grains, antistatic agents, various fine-grains, plasticizers, etc. may be added and mixed to formation materials of each layer, and thereby, improvement of characteristics may be given if needed.

As optical elements, an optical film in which other optical elements (optical layers) is laminated to the above described polarizing plate may be used on the occasion of practical use. Although there is especially no limitation about the optical layers, one layer or two layers or more of optical layers, which may be used for formation of a liquid crystal display etc., such as a reflector, a transflector, a retardation plate (a half wavelength plate and a quarter wavelength plate included), and a viewing angle compensation film, may be used. Especially preferable polarizing plates are; a reflective type polarizing plate or a transflective type polarizing plate in which a reflector or a transflective reflector is further laminated onto a polarizing plate of the present invention; an elliptically polarizing plate or a circular polarizing plate in which a retardation plate is further laminated onto the polarizing plate; a wide viewing angle polarizing plate in which a viewing angle compensation film is further laminated ont the polarizing plate; or a polarizing plate in which a brightness enhancement film is further laminated onto the polarizing plate. A hard coat film is applied to a side of a polarizing plate of an elliptical polarizing plate, a polarizing plate with optical compensation, etc.

Furthermore, if needed, there may also be given treatments for giving various characteristics, various functions, etc., such as scratch-proof property, durability, weatherability, wet heat resistance, heat resistance, moisture resistance, water vapor permeability, antistatic property, conductivity, improvement in adhesion between layers, and improvement in mechanical strength, or insertion, lamination of functional layers, etc.

A reflective layer is prepared on a polarizing plate to give a reflective type polarizing plate, and this type of plate is used for a liquid crystal display in which an incident light from a view side (display side) is reflected to give a display. This type of plate does not require built-in light sources, such as a backlight, but has an advantage that a liquid crystal display may easily be made thinner. A reflective type polarizing plate may be formed using suitable methods, such as a method in which a reflective layer of metal etc. is, if required, attached to one side of a polarizing plate through a transparent protective layer etc.

As an example of a reflective type polarizing plate, a plate may be mentioned on which, if required, a reflective layer is formed using a method of attaching a foil and vapor deposition film of high-reflectance metals, such as aluminum, to one side of a matte treated protective film.

Instead of a method in which a reflector is directly given to the protective film of the above-mentioned polarizing plate, a reflector may also be used as a reflective sheet constituted by preparing a reflective layer on the suitable film for the transparent film. In addition, since a reflective layer is usually made of metal, it is desirable that the reflective side is covered with a protective film or a polarizing plate etc. when used, from a viewpoint of preventing deterioration in reflectance by oxidation, of maintaining an initial reflectance for a long period of time and of avoiding preparation of a protective layer separately etc.

In addition, a transflective type polarizing plate may be obtained by preparing the above-mentioned reflective layer as a transflective type reflective layer, such as a half-mirror etc. that reflects and transmits light. A transflective type polarizing plate is usually prepared in the backside of a liquid crystal cell and it may form a liquid crystal display unit of a type in which a picture is displayed by an incident light reflected from a view side (display side) when used in a comparatively well-lighted atmosphere. And this unit displays a picture, in a comparatively dark atmosphere, using embedded type light sources, such as a back light built in backside of a transflective type polarizing plate. That is, the transflective type polarizing plate is useful to obtain of a liquid crystal display of the type that saves energy of light sources, such as a back light, in a well-lighted atmosphere, and can be used with a built-in light source if needed in a comparatively dark atmosphere etc.

The above-mentioned polarizing plate may be used as elliptically polarizing plate or circularly polarizing plate on which the retardation plate is laminated. A description of the above-mentioned elliptically polarizing plate or circularly polarizing plate will be made in the following paragraph. These polarizing plates change linearly polarized light into elliptically polarized light or circularly polarized light, elliptically polarized light or circularly polarized light into linearly polarized light or change the polarization direction of linearly polarization by a function of the retardation plate. As a retardation plate that changes circularly polarized light into linearly polarized light or linearly polarized light into circularly polarized light, what is called a quarter wavelength plate (also called $\lambda/4$ plate) is used. Usually, half-wavelength plate (also called $\lambda/2$ plate) is used, when changing the polarization direction of linearly polarized light.

Elliptically polarizing plate is effectively used to give a monochrome display without above-mentioned coloring by compensating (preventing) coloring (blue or yellow color) produced by birefringence of a liquid crystal layer of a super twisted nematic (STN) type liquid crystal display. Furthermore, a polarizing plate in which three-dimensional refractive index is controlled may also preferably compensate (prevent) coloring produced when a screen from a liquid crystal display is viewed from an oblique direction. Circularly polarizing plate is effectively used, for example, when adjusting a color tone of a picture of a reflective type liquid crystal display that provides a colored picture, and it also has function of antireflection. For example, a retardation plate may be used that compensates coloring and viewing angle, etc. caused by birefringence of various wavelength plates or liquid crystal layers etc. Besides, optical characteristics, such as retardation, may be controlled using laminated layer with two or more sorts of retardation plates having suitable retardation value according to each purpose. As retardation plates, birefringence films formed by stretching films comprising suitable polymers, such as polycarbonates, norbornene type resins, polyvinyl alcohols, polystyrenes, poly methyl methacrylates, polypropylene; polyallylates and polyamides; oriented films comprising liquid crystal materials, such as liquid crystal polymer; and films on which an alignment layer of a liquid crystal material is supported may be mentioned. A retardation plate may be a retardation plate that has a proper phase difference according to the purposes of use, such as various kinds of wavelength plates and plates aiming at compensation of coloring by birefringence of a liquid crystal layer and of visual angle, etc., and may be a retardation plate in which two or more sorts of retardation plates is laminated so that optical properties, such as retardation, may be controlled.

The above-mentioned elliptically polarizing plate and an above-mentioned reflected type elliptically polarizing plate are laminated plate combining suitably a polarizing plate or a reflective type polarizing plate with a retardation plate. This type of elliptically polarizing plate etc. may be manufactured by combining a polarizing plate (reflected type) and a retardation plate, and by laminating them one by one separately in the manufacture process of a liquid crystal display. On the other hand, the polarizing plate in which lamination was beforehand carried out and was obtained as an optical film, such as an elliptically polarizing plate, is excellent in a stable quality, a workability in lamination etc., and has an advantage in improved manufacturing efficiency of a liquid crystal display.

A viewing angle compensation film is a film for extending viewing angle so that a picture may look comparatively clearly, even when it is viewed from an oblique direction not from vertical direction to a screen. As such a viewing angle compensation retardation plate, in addition, a film having birefringence property that is processed by uniaxial stretching or orthogonal bidirectional stretching and a bidriectionally stretched film as inclined alignment film etc. may be used. As inclined alignment film, for example, a film obtained using a method in which a heat shrinking film is adhered to a polymer film, and then the combined film is heated and stretched or shrinked under a condition of being influenced by a shrinking force, or a film that is oriented in oblique direction may be mentioned. The viewing angle compensation film is suitably combined for the purpose of prevention of coloring caused by change of visible angle based on retardation by liquid crystal cell etc. and of expansion of viewing angle with good visibility.

Besides, a compensation plate in which an optical anisotropy layer consisting of an alignment layer of liquid crystal polymer, especially consisting of an inclined alignment layer of discotic liquid crystal polymer is supported with triacetyl cellulose film may preferably be used from a viewpoint of attaining a wide viewing angle with good visibility.

The polarizing plate with which a polarizing plate and a brightness enhancement film are adhered together is usually used being prepared in a backside of a liquid crystal cell. A brightness enhancement film shows a characteristic that reflects linearly polarized light with a predetermined polarization axis, or circularly polarized light with a predetermined direction, and that transmits other light, when natural light by back lights of a liquid crystal display or by reflection from a back-side etc., comes in. The polarizing plate, which is obtained by laminating a brightness enhancement film to a polarizing plate, thus does not transmit light without the predetermined polarization state and reflects it, while obtaining transmitted light with the predetermined polarization state by accepting a light from light sources, such as a backlight. This polarizing plate makes the light reflected by the brightness enhancement film further reversed through the reflective layer prepared in the backside and forces the light re-enter into the brightness enhancement film, and increases the quantity of the transmitted light through the brightness enhancement film by transmitting a part or all of the light as light with the predetermined polarization state. The polarizing plate simultaneously supplies polarized light that is difficult to be absorbed in a polarizer, and increases the quantity of the light usable for a liquid crystal picture display etc., and as a result luminosity may be improved. That is, in the case where the light enters through a polarizer from backside of a liquid crystal cell by the back light etc. without using a brightness enhancement film, most of the light, with a polarization direction different from the polarization axis of a polarizer, is absorbed by the polarizer, and does not transmit through the polarizer. This means that although influenced with the characteristics of the polarizer used, about 50 percent of light is absorbed by the polarizer, the quantity of the light usable for a liquid crystal picture display etc. decreases so much, and a resulting picture displayed becomes dark. A brightness enhancement film does not enter the light with the polarizing direction absorbed by the polarizer into the polarizer but reflects the light once by the brightness enhancement film, and further makes the light reversed through the reflective layer etc. prepared in the backside to re-enter the light into the brightness enhancement film. By this above-mentioned repeated operation, only when the polarization direction of the light reflected and reversed between the both becomes to have the polarization direction which may pass a polarizer, the brightness enhancement film transmits the light to supply it to the polarizer. As a result, the light from a backlight may be efficiently used for the display of the picture of a liquid crystal display to obtain a bright screen.

A diffusion plate may also be prepared between brightness enhancement film and the above described reflective layer, etc. A polarized light reflected by the brightness enhancement film goes to the above described reflective layer etc., and the diffusion plate installed diffuses passing light uniformly and changes the light state into depolarization at the same time. That is, the diffusion plate returns polarized light to natural light state. Steps are repeated where light, in the unpolarized state, i.e., natural light state, reflects through reflective layer and the like, and again goes into brightness enhancement film through diffusion plate toward reflective layer and the like. Diffusion plate that returns polarized light to the natural light state is installed between brightness enhancement film and the above described reflective layer, and the like, in this way, and thus a uniform and bright screen may be provided while maintaining brightness of display screen, and simultaneously controlling non-uniformity of brightness of the display screen. By preparing such diffusion plate, it is considered that number of repetition times of reflection of a first incident light increases with sufficient degree to provide uniform and bright display screen conjointly with diffusion function of the diffusion plate.

The suitable films are used as the above-mentioned brightness enhancement film. Namely, multilayer thin film of a dielectric substance; a laminated film that has the characteristics of transmitting a linearly polarized light with a predetermined polarizing axis, and of reflecting other light, such as the multilayer laminated film of the thin film having a different refractive-index anisotropy (D-BEF and others: manufactured by 3M Co., Ltd.); an aligned film of cholesteric liquid-crystal polymer; a film that has the characteristics of reflecting a circularly polarized light with either left-handed or right-handed rotation and transmitting other light, such as a film on which the aligned cholesteric liquid crystal layer is supported (PCF350: manufactured by NITTO DENKO CORPORATION, Transmax: manufactured by Merck Co., Ltd., and others); etc. may be mentioned.

Therefore, in the brightness enhancement film of a type that transmits a linearly polarized light having the above-mentioned predetermined polarization axis, by arranging the polarization axis of the transmitted light and entering the light into a polarizing plate as it is, the absorption loss by the polarizing plate is controlled and the polarized light can be transmitted efficiently. On the other hand, in the brightness enhancement film of a type that transmits a circularly polarized light as a cholesteric liquid-crystal layer, the light may be entered into a polarizer as it is, but it is desirable to enter the light into a polarizer after changing the circularly polarized light to a linearly polarized light through a retardation plate, taking control an absorption loss into consideration. In addition, a circularly polarized light is convertible into a linearly polarized light using a quarter wavelength plate as the retardation plate.

A retardation plate that works as a quarter wavelength plate in a wide wavelength ranges, such as a visible-light region, is obtained by a method in which a retardation layer working as a quarter wavelength plate to a pale color light with a wavelength of 550 nm is laminated with a retardation layer having other retardation characteristics, such as a retardation layer working as a half-wavelength plate. Therefore, the retardation plate located between a polarizing plate and a brightness enhancement film may consist of one or more retardation layers.

In addition, also in a cholesteric liquid-crystal layer, a layer reflecting a circularly polarized light in a wide wavelength ranges, such as a visible-light region, may be obtained by adopting a configuration structure in which two or more layers with different reflective wavelength are laminated together. Thus a transmitted circularly polarized light in a wide wavelength range may be obtained using this type of cholesteric liquid-crystal layer.

Moreover, the polarizing plate may consist of multi-layered film of laminated layers of a polarizing plate and two of more of optical layers as the above-mentioned separated type polarizing plate. Therefore, a polarizing plate may be a reflective type elliptically polarizing plate or a semi-transmission type elliptically polarizing plate, etc. in which the above-mentioned reflective type polarizing plate or a transflective type polarizing plate is combined with above described retardation plate respectively.

Although a laminating of the above described hard coat film to the optical element may be formed by a method in which laminating is separately carried out sequentially in manufacturing process of a liquid crystal display etc., an optical film in a form of being laminated beforehand has an outstanding advantage that it has excellent stability in quality and assembly workability, etc., and thus manufacturing processes ability of a liquid crystal display etc. may be raised. Proper adhesion means, such as an adhesive layer, may be used for laminating. On the occasion of adhesion of the above described polarizing plate and other optical films, the optical axis may be set as a suitable configuration angle according to the target retardation characteristics etc.

At least one layer of the polarizing plate mentioned above and the optical film element is laminated with the hard coat film. And on the another layer not prepared the hard coat film, an adhesive layer may also be prepared for adhesion with other members, such as a liquid crystal cell etc. As pressure sensitive adhesive that forms adhesive layer is not especially limited, and, for example, acrylic type polymers; silicone type polymers; polyesters, polyurethanes, polyamides, polyethers; fluorine type and rubber type polymers may be suitably selected as a base polymer. Especially, a pressure sensitive adhesive such as acrylics type pressure sensitive adhesives may be preferably used, which is excellent in optical transparency, showing adhesion characteristics with moderate wettability, cohesiveness and adhesive property and has outstanding weather resistance, heat resistance, etc.

Moreover, an adhesive layer with low moisture absorption and excellent heat resistance is desirable. This is because those characteristics are required in order to prevent foaming and peeling-off phenomena by moisture absorption, in order to prevent decrease in optical characteristics and curvature of a liquid crystal cell caused by thermal expansion difference etc. and in order to manufacture a liquid crystal display excellent in durability with high quality.

The adhesive layer may contain additives, for example, such as natural or synthetic resins, adhesive resins, glass fibers, glass beads, metal powder, fillers comprising other inorganic powder etc., pigments, colorants and antioxidants. Moreover, it may be an adhesive layer that contains fine particle and shows optical diffusion nature.

Proper method may be carried out to attach an adhesive layer to the optical element or the optical film. As an example, about 10 to 40 weight % of the pressure sensitive adhesive solution in which a base polymer or its composition is dissolved or dispersed, for example, toluene or ethyl acetate or a mixed solvent of these two solvents is prepared. A method in which this solution is directly applied on a polarizing plate top or an optical film top using suitable developing methods, such as flow method and coating method, or a method in which an adhesive layer is once formed on a separator, as mentioned above, and is then transferred on a polarizing plate or an optical film may be mentioned. An adhesive layer may also be prepared on each layer as a layer in which pressure sensitive adhesives with different composition or different kind etc. are laminated together. Thickness of an adhesive layer may be suitably determined depending on a purpose of usage or adhesive strength, etc., and generally is 1 to 500 μm, preferably 5 to 200 μm, and more preferably 10 to 100 μm.

A temporary separator is attached to an exposed side of an adhesive layer to prevent contamination etc., until it is practically used. Thereby, it can be prevented that foreign matter contacts adhesive layer in usual handling. As a separator, without taking the above-mentioned thickness conditions into consideration, for example, suitable conventional sheet materials that is coated, if necessary, with release agents, such as silicone type, long chain alkyl type, fluorine type release agents, and molybdenum sulfide may be used. As a suitable sheet material, plastics films, rubber sheets, papers, cloths, no woven fabrics, nets, foamed sheets and metallic foils or laminated sheets thereof may be used.

In addition, in the present invention, ultraviolet absorbing property may be given to the above-mentioned each layer, such as a polarizer for a polarizing plate, a transparent protective film and an optical film etc. and an adhesive layer, using a method of adding UV absorbents, such as salicylic acid ester type compounds, benzophenol type compounds, benzotriazol type compounds, cyano acrylate type compounds, and nickel complex salt type compounds.

An optical element of the present invention may be preferably used for manufacturing various equipment, such as liquid crystal display, etc. Assembling of a liquid crystal display may be carried out according to conventional methods. That is, a liquid crystal display is generally manufactured by suitably assembling several parts such as a liquid crystal cell, optical films and, if necessary, lighting system, and by incorporating driving circuit. In the present invention, except that an optical film by the present invention is used, there is especially no limitation to use any conventional methods. Also any liquid crystal cell of arbitrary type, such as TN type, and STN type, π type may be used.

Suitable liquid crystal displays, such as liquid crystal display with which the above-mentioned optical film has been located at one side or both sides of the liquid crystal cell, and with which a backlight or a reflector is used for a lighting system may be manufactured. In this case, the optical film by the present invention may be installed in one side or both sides of the liquid crystal cell. When installing the optical films in both sides, they may be of the same type or of different type. Furthermore, in assembling a liquid crystal display, suitable parts, such as diffusion plate, antiglare layer, antireflection film, protective plate, prism array, lens array sheet, optical diffusion plate, and backlight, may be installed in suitable position in one layer or two or more layers.

Subsequently, organic electro luminescence equipment (organic EL display) will be explained. Generally, in organic EL display, a transparent electrode, an organic luminescence layer and a metal electrode are laminated on a transparent substrate in an order configuring an illuminant (organic electro luminescence illuminant). Here, an organic luminescence layer is a laminated material of various organic thin films, and much compositions with various combination are known, for example, a laminated material of hole injection layer comprising triphenylamine derivatives etc., a luminescence layer comprising fluorescent organic solids, such as anthracene; a laminated material of electronic injection layer comprising such a luminescence layer and perylene derivatives, etc.; laminated material of these hole injection layers, luminescence layer, and electronic injection layer etc.

An organic EL display emits light based on a principle that positive hole and electron are injected into an organic luminescence layer by impressing voltage between a transparent electrode and a metal electrode, the energy produced by recombination of these positive holes and electrons excites fluorescent substance, and subsequently light is emitted when excited fluorescent substance returns to ground state. A mechanism called recombination which takes place in an intermediate process is the same as a mechanism in common diodes, and, as is expected, there is a strong non-linear relationship between electric current and luminescence strength accompanied by rectification nature to applied voltage.

In an organic EL display, in order to take out luminescence in an organic luminescence layer, at least one electrode must be transparent. The transparent electrode usually formed with transparent electric conductor, such as indium tin oxide (ITO), is used as an anode. On the other hand, in order to make electronic injection easier and to increase luminescence efficiency, it is important that a substance with small work function is used for cathode, and metal electrodes, such as Mg—Ag and Al—Li, are usually used.

In organic EL display of such a configuration, an organic luminescence layer is formed by a very thin film about 10 nm in thickness. For this reason, light is transmitted nearly completely through organic luminescence layer as through transparent electrode. Consequently, since the light that enters, when light is not emitted, as incident light from a surface of a transparent substrate and is transmitted through a transparent electrode and an organic luminescence layer and then is reflected by a metal electrode, appears in front surface side of the transparent substrate again, a display side of the organic EL display looks like mirror if viewed from outside.

In an organic EL display containing an organic electro luminescence illuminant equipped with a transparent electrode on a surface side of an organic luminescence layer that emits light by impression of voltage, and at the same time equipped with a metal electrode on a back side of organic luminescence layer, a retardation plate may be installed between these transparent electrodes and a polarizing plate, while preparing the polarizing plate on the surface side of the transparent electrode.

Since the retardation plate and the polarizing plate have function polarizing the light that has entered as incident light from outside and has been reflected by the metal electrode, they have an effect of making the mirror surface of metal electrode not visible from outside by the polarization action. If a retardation plate is configured with a quarter wavelength plate and the angle between the two polarization directions of the polarizing plate and the retardation plate is adjusted to $\pi/4$, the mirror surface of the metal electrode may be completely covered.

This means that only linearly polarized light component of the external light that enters as incident light into this organic EL display is transmitted with the work of polarizing plate. This linearly polarized light generally gives an elliptically polarized light by the retardation plate, and especially the retardation plate is a quarter wavelength plate, and moreover when the angle between the two polarization directions of the polarizing plate and the retardation plate is adjusted to $\pi/4$, it gives a circularly polarized light.

This circularly polarized light is transmitted through the transparent substrate, the transparent electrode and the organic thin film, and is reflected by the metal electrode, and then is transmitted through the organic thin film, the transparent electrode and the transparent substrate again, and is turned into a linearly polarized light again with the retardation plate. And since this linearly polarized light lies at right angles to the polarization direction of the polarizing plate, it cannot be transmitted through the polarizing plate. As the result, mirror surface of the metal electrode may be completely covered.

This circularly polarized light is transmitted through the base material film, the transparent electrode and the organic thin film, and is reflected by the metal electrode, and then is transmitted through the organic thin film, the transparent electrode and the base material film again, and is turned into a linearly polarized light again with the retardation plate. And since this linearly polarized light lies at right angles to the polarization direction of the polarizing plate, it cannot be transmitted through the polarizing plate. As the result, mirror surface of the metal electrode may be completely covered.

EXAMPLES

Although illustrative description of the present invention will be hereinafter given with reference to Examples, the present invention is not limited at all by these Examples.

Evaluation method (1) Viscosity

Viscosities of the coated liquids at a rate of shear 10 [1/s] was measured at temperature conditions in each drying step using rheometer (RS-1) manufactured by HAAKE. In addition, viscosities of the coating liquids were measured in the initial drying process, and at the first drying process and the second drying process, viscosities of the coated liquids under concentration and temperature conditions in an entrance of the drying step concerned were measured.

(2) Appearance

Appearance of the coated layers was observed visually under three wavelength fluorescent lamps, and evaluated for uniformity of appearance by following standard.

O: Large pitch of interference fringe observed x: Fine pitch of interference fringe and random pattern observed Manufacturing Example 1

A trifunctional ultraviolet curing type urethane acrylate resin was dissolved in toluene to prepare a coating liquid A having a concentration of 30% by weight. Table 1 shows viscosities of coating liquids A at 25° C.

Manufacturing Examples 2 Through 5

Except that types of solvents and resin concentrations in manufacturing example 1 were changed as shown in Table 1, same methods as in manufacturing example 1 were repeated, and coating liquids B through E were prepared. Table 1 shows viscosities of coating liquids B through E at 25° C.

Manufacturing Examples 6

A liquid crystal monomer (A) represented by the formula (1) (polymerizable rod-like nematic liquid crystal) and a chiral agent (B) represented by formula (2) were blended to obtain a composition having a ratio of (A):(B)=8:1 by a weight ratio. The composition was dissolved in toluene to prepare a concentration of 30% by weight. The photo polymerization initiator (Irgacure manufactured by Ciba Specialty Chemicals) was added to the composition to prepare a coating liquid F, adjusted so that it might have 3% by weight. Table 1 shows viscosities of the obtained coating liquid F at 25° C.

Examples 1 Through 5 and Comparative Examples 1 Through 5

Coated sheets were formed using a coating device shown in FIG. 2. As a substrate, a biaxial stretched polyethylene terephthalate film (manufactured by Toray Industries, thickness: 75 μm) was used, coating liquids A through E shown in Table 2 were coated by a coated amount of 13 [g/m$^2$] using a die coating method, and then they were dried under drying conditions shown in Table 2 to form coated layers. Viscosities of the coated liquid after passing each drying process were calculated using following evaluation meth-

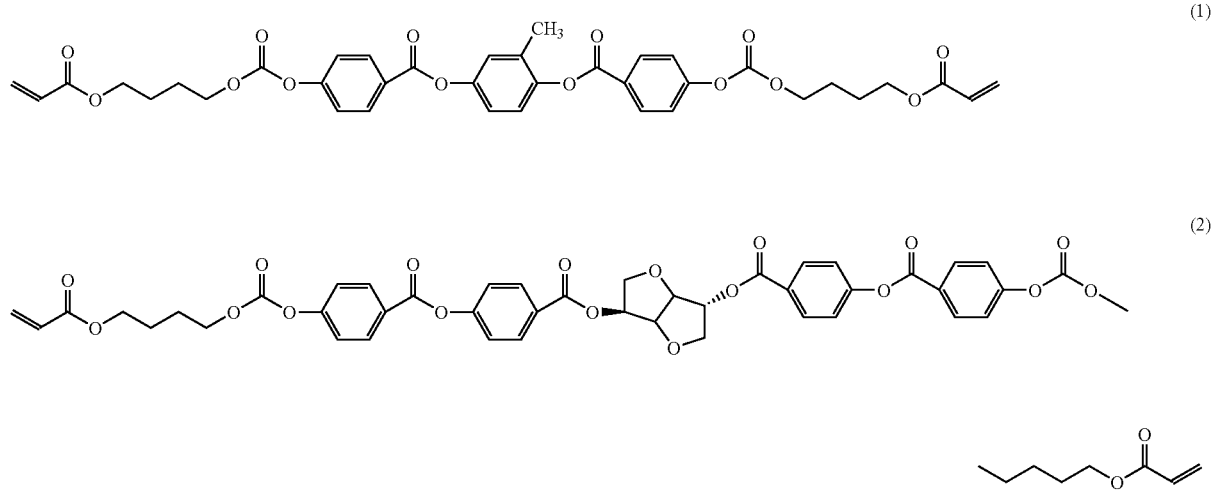

(1)

(2)

Manufacturing Examples 7

Except that types of solvents in manufacturing example 6 was changed as shown in Table 1, same methods as in manufacturing example 6 were repeated, and a coating liquid G was prepared. Table 1 shows viscosities of a coating liquid G at 25° C.

ods. Table 2 shows results. Moreover, after drying process, curing treatment with UV irradiation was further provided to the coated layers.

Examples 6, 7 and Comparative Examples 6, 7

On the triacetylcellulose (TAC) film (T-50SH: manufactured by Fiji Photo Film) having 50 μm in thickness, water solution containing 1% polyvinyl alcohol (PVA) (NH-18: manufactured by Nippon Synthetic Chemical Industry) by weight was coated, and then they were dried at 90° C. to form the PVA coated layers having 0.01 μm or less in thickness. Then rubbing processing was given to the surface of the coated films to form oriented films. On the oriented films, coating liquids F and G shown in Table 1 were coated by a coated amount of 13 [g/m$^2$] using a die coating method, and they were dried under drying conditions shown in Table 2. Then curing treatment with UV irradiation was further provided to the coated layers to polymerize the monomers.

Evaluation Result

Table 2 shows thicknesses (μm) and appearance of the coated layers obtained in Examples and Comparative examples.

TABLE 1

| Coating liquid | Solvent | Resin concentration (%) | Initial viscosity (mPa · s) |
| --- | --- | --- | --- |
| A | Toluene | 30 | 5 |
| B | Ethyl acetate | 30 | 3 |
| C | Ethyl cellosolve | 30 | 3 |
| D | Ethyl cellosolve | 40 | 5 |
| E | Ethyl cellosolve | 50 | 7 |
| F | Toluene | 30 | 3 |
| G | Cyclohexanone | 30 | 6 |

TABLE 2

| | Coating liquid Initial viscosity [mPa·s] | Drying conditions | | | | | | | | | | | | | |
|---|---|---|---|---|---|---|---|---|---|---|---|---|---|---|---|
| | | Initial drying process | | | | First drying process | | | | Second drying process | | | | | |
| | | Drying conditions | | | Viscosity after passage [mPa·s] | Drying conditions | | | Viscosity after passage [mPa·s] | Drying conditions | | | Viscosity after passage [mPa·s] | Thickness (μm) | Appearance |
| Sample | | Temperature | Period | Wind speed | | Temperature | Period | Wind speed | | Temperature | Period | Wind speed | | | |
| Example 1 | A / 5 | 25° C. | 30 s | 0 m/s | 15 | 40° C. | 40 s | 3 m/s | 20 | 60° C. | 40 s | 3 m/s | 250 | 6.5 | ○ |
| Comparative example 1 | A / 5 | 25° C. | 30 s | 0 m/s | 15 | 40° C. | 40 s | 13 m/s | 20 | 60° C. | 40 s | 13 m/s | 250 | 6.5 | x |
| Example 2 | B / 3 | 25° C. | 30 s | 0 m/s | 15 | 40° C. | 40 s | 3 m/s | 20 | 60° C. | 40 s | 3 m/s | 250 | 6.5 | ○ |
| Comparative example 2 | B / 3 | 25° C. | 30 s | 0 m/s | 15 | 40° C. | 40 s | 13 m/s | 20 | 60° C. | 40 s | 13 m/s | 250 | 6.5 | x |
| Example 3 | C / 3 | 25° C. | 30 s | 0 m/s | 15 | 40° C. | 40 s | 3 m/s | 20 | 60° C. | 40 s | 3 m/s | 250 | 6.5 | ○ |
| Comparative example 3 | C / 3 | 25° C. | 30 s | 0 m/s | 15 | 40° C. | 40 s | 13 m/s | 20 | 60° C. | 40 s | 13 m/s | 250 | 6.5 | x |
| Example 4 | D / 5 | 25° C. | 30 s | 0 m/s | 17 | 40° C. | 40 s | 3 m/s | 20 | 60° C. | 40 s | 3 m/s | 250 | 6.5 | ○ |
| Comparative example 4 | D / 5 | 25° C. | 30 s | 0 m/s | 17 | 40° C. | 40 s | 13 m/s | 20 | 60° C. | 40 s | 13 m/s | 250 | 6.5 | x |
| Example 5 | E / 7 | 25° C. | 30 s | 0 m/s | 20 | 40° C. | 40 s | 3 m/s | 20 | 60° C. | 40 s | 3 m/s | 250 | 6.5 | ○ |
| Comparative example 5 | E / 7 | 25° C. | 30 s | 0 m/s | 20 | 40° C. | 40 s | 13 m/s | 20 | 60° C. | 40 s | 13 m/s | 250 | 6.5 | x |
| Example 6 | F / 3 | 25° C. | 20 s | 0 m/s | 4 | 40° C. | 30 s | 3 m/s | 50 | 90° C. | 30 s | 3 m/s | >200 | 3.9 | ○ |
| Comparative example 6 | F / 3 | 25° C. | 20 s | 0 m/s | 4 | 40° C. | 30 s | 13 m/s | 150 | 90° C. | 30 s | 13 m/s | >200 | 3.9 | x |
| Example 7 | G / 6 | 25° C. | 20 s | 0 m/s | 7 | 40° C. | 30 s | 3 m/s | 40 | 90° C. | 30 s | 3 m/s | >200 | 3.9 | ○ |
| Comparative example 7 | G / 6 | 25° C. | 20 s | 0 m/s | 7 | 40° C. | 30 s | 13 m/s | 150 | 90° C. | 30 s | 13 m/s | >200 | 3.9 | x |

In the Examples, all average wind speeds in the first and second drying process are 3 m/s or less, average wind speeds in drying processes are 10 m/s or less until viscosities of the coated liquid reach 250 [mPa·s] at the time of passage of the second drying processes, therefore formation of coated layers with uniform appearance is recognized. On the other hand, in Comparative examples, all average wind speeds in the first and second drying process are 13 m/s or less, average wind speeds exceed 10 m/s in drying processes until viscosities of the coated liquid reach 50 [mPa·s], and therefore coated layers with uniform appearance are not formed.

What is claimed is:

1. A method for manufacturing a coated sheet to form a coated layer by a process including a process for coating a coating liquid including a resin material and a solvent on a substrate, and a drying process for drying a coated liquid, wherein said drying process comprises:

performing an initial drying process without using a drying wind and at ordinary temperature, and performing a thermal drying process under a drying wind flow after the initial drying, wherein, in the thermal drying process, drying is performed under drying wind flow having an average wind speed of 10 m/s or less until a viscosity of the coated liquid in the thermal drying process reaches at least 50 mPa·s at drying temperatures.

2. The method for manufacturing a coated sheet according to claim 1, wherein
an initial viscosity of the coated liquid in the drying process is 0.1 through 20 mPa·s at 25° C.

3. The method for manufacturing a coated sheet according to claim 1, wherein
the coated layer has a thickness after drying of 10 µm or less.

4. The method for manufacturing a coated sheet according to claim 2, wherein
the coated layer has a thickness after drying of 10 µm or less.

5. The method for manufacturing a coated sheet according to claim 1, wherein
the coated layer is an optical functional layer.

6. The method for manufacturing a coated sheet according to claim 2, wherein
the coated layer is an optical functional layer.

7. The method for manufacturing a coated sheet according to claim 3, wherein
the coated layer is an optical functional layer.

8. The method for manufacturing a coated sheet according to claim 4, wherein the coated layer is an optical functional layer.

9. The method for manufacturing a coated sheet according to claim 1, wherein
the heat drying process is performed several times, and the temperature for drying is set progressively higher within a range of 30° C. through 200° C. every time the heat drying process is carried out.

10. The method for manufacturing a coated sheet according to claim 1, wherein
the coating liquid contains the resin material and the solvent, and comprises an optically functional material.

11. The method for manufacturing a coated sheet according to claim 10, wherein
the material which expresses the optical function is a material having a phase difference function.

12. The method for manufacturing a coated sheet according to claim 1, wherein said initial drying process is carried out for at most 30 seconds starting immediately after the application of said coating liquid, and said thermal drying process comprises a first drying process which is carried out for at most 40 seconds starting immediately after the initial drying process and a second drying process which is carried out for at most 40 seconds starting immediately after the first drying process.

13. The method for manufacturing a coated sheet according to claim 12, wherein said second drying process is a process which is carried out at an average wind speed of 10 m/s or less until a viscosity of the coated liquid reaches at least more than 200 mPa·s.

14. The method for manufacturing a coated sheet according to claim 1, wherein the concentration of the resin component in said coating liquid is 1% by weight.

15. The method for manufacturing a coated sheet according to claim 1, wherein said initial drying process is a constant-rate drying and said thermal drying process is a decreased-rate drying.

* * * * *